United States Patent [19]

Jack

[11] Patent Number: 4,701,381
[45] Date of Patent: Oct. 20, 1987

[54] COMPOSITE MATERIALS AND PRODUCTS

[75] Inventor: Kenneth H. Jack, North Shields, Great Britain

[73] Assignee: The University of Newcastle Upon Tyne, Newcastle Upon Tyne, Great Britain

[21] Appl. No.: 756,453

[22] Filed: Jul. 18, 1985

[30] Foreign Application Priority Data

Jul. 18, 1984 [GB] United Kingdom ............... 8418363

[51] Int. Cl.$^4$ .................. C22C 29/04; C22C 29/16
[52] U.S. Cl. .................................. 428/548; 75/230; 75/244; 75/245; 75/246
[58] Field of Search ............... 75/233, 234, 237, 238, 75/240, 241, 242, 243, 244, 230, 245, 246; 428/548

[56] References Cited

U.S. PATENT DOCUMENTS

| | | | |
|---|---|---|---|
| 4,145,213 | 3/1979 | Oskarsson et al. | 75/238 |
| 4,162,392 | 7/1979 | Brown et al. | 219/146.51 |
| 4,177,324 | 12/1979 | Brown et al. | 428/627 |
| 4,263,046 | 4/1981 | Fichte et al. | 75/252 |

FOREIGN PATENT DOCUMENTS

| | | | |
|---|---|---|---|
| 56-69349 | 6/1981 | Japan | 75/233 |
| 58-204149 | 11/1983 | Japan | 75/233 |
| 58-217656 | 12/1983 | Japan | 75/236 |

OTHER PUBLICATIONS

Metals Handbook 8th Edition, pp. 235 and 242, 1973.
D. A. Evans, Thesis Extracts, (1957), pp. 81–96.
P. Grieveson, Thesis, (1960), pp. 6–7, 17–18 and 38–50.
K. M. Nutter, Thesis Extracts, (1969), pp. 48–51 and 71–81.

Primary Examiner—John F. Terapane
Assistant Examiner—Eric Jorgensen
Attorney, Agent, or Firm—Burns, Doane, Swecker & Mathis

[57] ABSTRACT

Composite materials and products are described composed of a mixed metal interstitial alloy in the form of a carbide, nitride, carbonitride, oxynitride, oxycarbide or carboxynitride with the $\beta^m$($\beta$-manganese) metal-atom arrangement, and a metallic carrier. With the carrier in the form of a binder phase for particles of the alloy a hard metal can be obtained which has a hardness not much less than a conventional WC-Co hard metal. Alternatively the alloy can be employed as a coating for a metallic substrate, for example to increase resistance to corrosion and oxidation. In a preferred composition, the interstitial alloy is nickel-molybdenum-nitride and nickel is used as the binder or the substrate material.

7 Claims, 5 Drawing Figures

COMPOSITE MATERIALS AND PRODUCTS

BACKGROUND OF THE INVENTION

This invention relates to composite materials, in particular head metals, and products manufactured therefrom, and also coatings for metallic articles and the composite products formed thereby.

Hard metals have found a wide commercial use over a considerable period of time, for example in metal-cutting tools and as wear-resistant coatings for metal components. The hard metals employed for these purposes typically comprise particles of tungsten carbide, formed as a dense compact with cobalt acting as a binder for the particles by sintering or hot-pressing.

The success of known hard metals has brought with it the problem that the products for a large range of uses rely on the availability of tungsten an cobalt as essential ingredients and it is an object of the present invention to provide a hard metal in which the use of one or both of tungsten and cobalt is avoided or can be reduced as compared with conventional materials.

SUMMARY OF THE INVENTION

According to one aspect of the invention, there is provided a composite material or product comprising a mixed metal interstitial alloy in the form of a carbide, nitride, carbonitride, oxycarbide, oxynitride or carboxynitride with the $\beta^m$ ($\beta$-manganese) metal-atom arrangement, and a metallic carrier.

The material may be in the form of a hard metal, with the metallic carrier functioning as a binder phase for the interstitial alloy, or the alloy may be a coating applied to the surface of a preformed metallic body.

A preferred range of $\beta^m$ interstitial alloys is provided by using a mixed metal system consisting of molybdenum with one or more transition metals, such as chromium, manganese, iron or nickel. In particular the composition $\beta^m$-Ni$_2$Mo$_3$N has been found to show especially high thermodynamic stability. It is also possible to substitute molybdenum partially by tungsten, niobum, tantalum, manganese or chromium in such a system.

Thus, two-thirds of the molybdenum can be replaced by chromium, and smaller concentrations of up to about one molybdenum atom in twelve can be replaced by niobium and tantalum. The nickel can be replaced by manganese, iron or cobalt depending on the nitrogen potential.

Such $\beta^m$ interstitial alloys are isostructural with $\beta$-Mn and among their properties are a high interatomic bond strength and a crystal structure in which easy glide is impossible. The structures are complex and each interstitial atom is coordinated by a distorted trigonal prism of metal atoms.

A preferred binder material for a hard metal according to the invention is nickel, but Fe, Co, Cr and Mn may replace Ni in either or both the $\beta^m$-phase and the binder phase, wholly or partially. In addition, the substitution of copper for nickel (up to the composition 60 Ni:40 Cu) in the binder can increase toughness. As a mixed binder phase, Ni or the metals Cr, Mn, Fe and Co may also be combined with Mo. The proportion of binder to $\beta^m$-phase will be dictated by the required properties of the hard metal but in general it will be undesirable to have less than 5 v/o binder, as measured in the sintered composition, and more usually there will be not substantially less than 10 v/o.

According to another aspect of the invention, there is provided a composite material or product comprising a mixed metal interstitial alloy in the form of a carbide, nitride, carbonitride, oxynitride, oxycarbide or carboxynitride with the $\beta^m$ ($\beta$-manganese) metal-atom arrangement, and a metallic carrier.

DESCRIPTION OF THE PREFERRED EMBODIMENTS

There follows by way of illustration a more detailed description of some methods by which $\beta^m$ nickel-molybdenum nitride ($\beta^m$-Ni$_2$Mo$_3$N), a phase exhibiting high thermodynamic stability and composite materials comprising the nitride, can be prepared.

EXAMPLE 1

Nickel molybdate was reduced in hydrogen containing trace impurities of nitrogen. The mixed metals acted as a "getter" for nitrogen, and as little as 0.5 v/oN$_2$ in otherwise pure H$_2$ was found to give the $\beta^m$-nitride at 800° C. Analysis of the material so produced showed that it had remarkable thermodynamic stability, which indicates a high interatomic bond strength.

EXAMPLE 2

Molybdenum and nickel powders with a particle size of less than 53$\mu$ were vibro-milled dry using steel balls, and were cold-pressed at approximately 140 MPa ($\sim$20000 psi) to form pelletised components 10 mm diameter by 8 mm high which were then nitrided at 1000° C. in an atmosphere of cracked ammonia (25N$_2$:75H$_2$) for 4 hours. The product was crushed in a percussion mortar and sieved. Particles of a size larger than 53$\mu$ were vibro-milled using dry tungsten carbide balls and all the material was then wet-milled, using tungsten carbide balls to a particle size of less than 10$\mu$. Carbonyl nickel powder with a particle size less than 3$\mu$ was added as a binder material and the mixture cold-pressed to give green compacts which were then hot-pressed at 27 MPa ($\sim$4000 psi) at 1200° C. for 20 minutes.

EXAMPLE 3

The method of Example 2 was followed but after adding the carbonyl nickel powder the mixture was wet-milled for two days in a stainless steel mill with WC balls in isopropyl alcohol. The mixed powder was dried under an infra-red lamp, pelletised by (i) cold uniaxial pressing in a steel die at 226 MPa ($\sim$32500 psi) and then (ii) cold isostatic pressing at 172 MPa ($\sim$25000 psi). The cyclindrical pellets ($\sim$10 mm high $\times$ $\sim$10 mm diameter) were then heated in 2H$_2$:1N$_2$ gas mixture for 12 h at 600° C. to reduce any oxide to metal. Finally the pellets were pressureless sintered in 1H$_2$:1N$_2$ for 2 h at 1200° C., slow cooled to 600° C. in 2 hours, and finally cooled quickly or quenched in a gas flow to room temperature.

Under the same conditions as Example 2, 25 a/o Ni can be replaced by Fe and 75 a/o by Co in the $\beta^m$ structure. Pure $\beta^m$ phases Fe$_2$Mo$_3$N and Co$_2$Mo$_3$N can be obtained by nitriding with NH$_3$:H$_2$ mixtures or with molecular nitrogen at high pressure, e.g. 30 atm.

Other preparation methods are possible, particularly for the preparation of substituted $\beta^m$-phase materials, e.g. using as starting materials mixed metal oxides, hydroxides, carbonates, oxalates and other salts or metal oxides etc. with ammonium molybdate.

Figure 1:
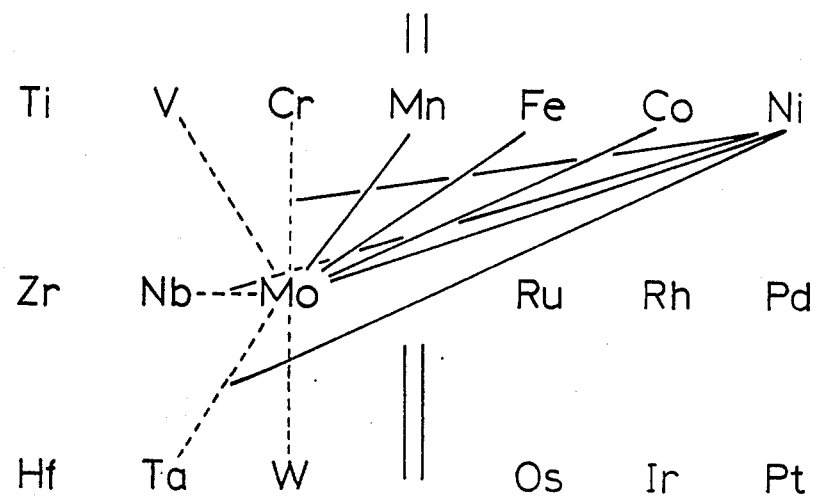
Figure 3:
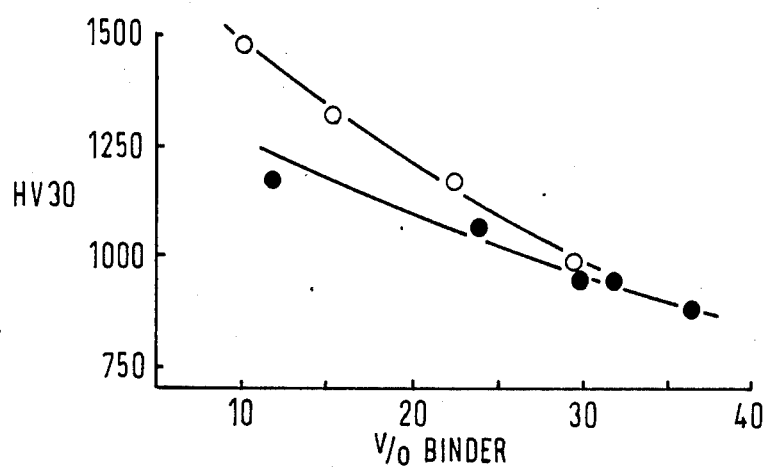
Figure 2A:
Figure 2B:
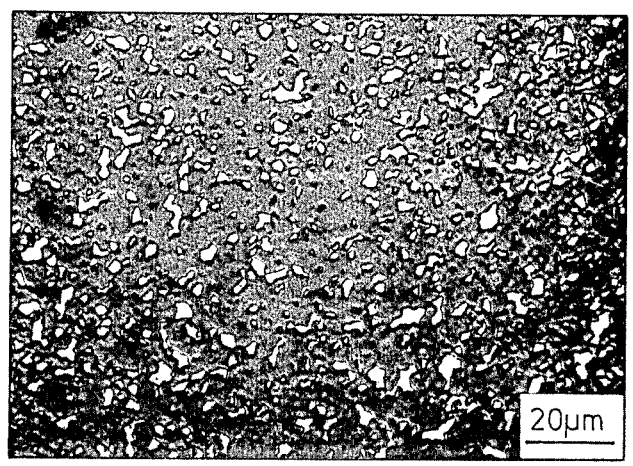
Figure 2C:
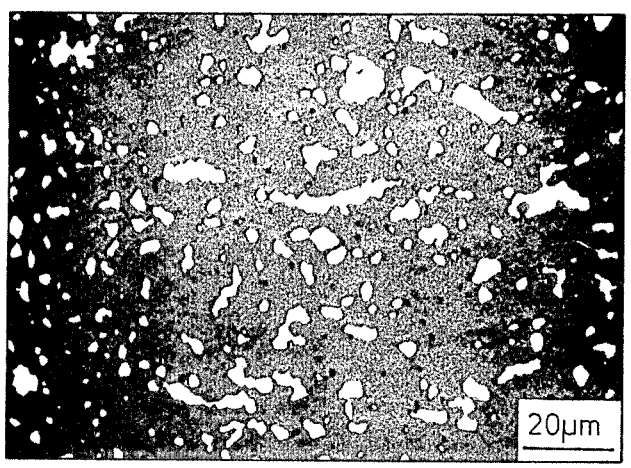

Reference will now be made to the accompanying illustrations, in which:

FIG. 1 is a table illustrating the "Effective Periodic Group Number" of the metals to be found in the $\beta m$ phase, FIG. 2 is a group of optical micrographs showing the microstructures of some hard metal samples according to the invention, FIG. 3 is a graphical comparison of samples of hard metal according to the present invention with WC:Co samples.

One determining factor for the existence of $\beta^m$ phases is an Effective Group Number in the Periodic Table near that of $\beta$-manganese metal and FIG. 1 illustrates possible substitutions of metals in the phase within the scope of this factor. Thus, Fe and Co will replace Ni while Cr, Nb, Ta and possibly other elements, such as V, of Groups lower than 7, will replace Mo. Mn in Group 7 is found to replace both Ni and Mo. In individual cases the substitutions may be total, but are more usually partial, as with the substitution already referred to of up to two-thirds of the Mo by Cr. The substitution of Ni by Fe or Co also referred to above can, in a nitrogen atmosphere only be partial unless the nitrogen potential is raised sufficiently, e.g. by use of an atmosphere of mixed ammonia and hydrogen, say $10NH_3:90H_2$.

Replacement of only one Mo atom in 12 by Nb and Ta to give $\beta^m$ phase with limiting compositions $Ni_8Mo_{11}NbN_4$ and $Ni_8Mo_{11}TaN_4$ is possible, and similarly replacement has been made of up to nearly 1 mo in 6 with V to give a composition $Ni_8Mo_{10.3}V_{1.7}N_4$.

Mn can replace both Ni and Mo in $Ni_2Mo_3$ N to a limit of about 5 atomic percent in each case, i.e. up to unit-cell contents $(Ni_4Mn_4)(Mo_6Mn_6)N_4$.

The metals Cr, V, Nb, Ta, Mn have a high affinity for oxygen and the preparation of $\beta^m$-phases containing these constituents requires oxygen-free and water-free gases and furnace environments, i.e. low oxygen potentials. These conditions may be achieved more readily with carbon present and so there can be some advantage in forming the $\beta^m$-carbonitrides rather than the $\beta^m$-nitrides.

For example, a pelletised mixture of Ni and Mo powders plus carbon black can be nitrided in molecular nitrogen or $N_2:H_2$ at temperatures up to 1200° C. by a method otherwise similar to that given in Example 1 to give $\beta^m$ carbonitrides in which up to one half of the nitrogen of $Ni_2Mo_3N$ is replaced by carbon, i.e. corresponding to unit-cell contents $\beta^m$-$Ni_8Mo_{12}C_2N_2$.

As an example of a combined substitution, $\beta^m$ carbonitrides with 0.2 C and 0.4 C per mole, i.e. $Ni_2Mo_3N_{0.8}C_{0.2}$ and $Ni_2Mo_3N_{0.6}C_{0.4}$, have been prepared by the method already described but with up to one-half of the Mo replaced by Cr. This gives a range of homogeneity for the $\beta^m$-nickel-molybdenum-chromium-carbonitride, expressed in terms of the unit-cell contents, of $Ni_8Mo_{12-x}Cr_xN_{4-y}C_y$ in which x varies from 0 to 6 and y from 0 to 1.6.

FIG. 2 illustrates for purposes of comparison, optical micrographs of pressureless sintered samples produced from mixes with an initial composition of $\beta^m$-$Ni_2Mo_3N$ with, respectively, (a) 5 w/o nickel, (b) 10 w/o nickel, and (c) 8 w/o nickel plus 2 w/o molybdenum. The illustrations show microstructures consisting of a skeleton of nitride grains (darker etching) fused together, with the pores of the skeleton filled with binder phase (lighter etching). Considerable grain growth occurs during prolonged pressureless-sintering, as compared with rapid hot-pressing, but sintering at lower temperatures or shorter times can produce a more finely dispersed nitride phase within a more uniformly distributed binder phase.

FIG. 3 compares the hardness in one series of tests (indicated by the solid spots) of the samples produced by pressureless sintering, as in Example 3 above, with that of a hard metal consisting of coarse-grain tungsten carbide in cobalt, the test results of which are indicated by the circles. The graph shows that the sintered product of Example 3, which had a density of 99.8±0.1% relative to the theoretical value, exhibited hardnesses approaching those of the WC:Co. The comparability of the materials was particularly marked with increasing volumes of binder. In a further group of tests, designed to show the effects of admixture of Mo in the Ni binder, results were obtained as shown in the following table:

TABLE 1

| Alloy | Binder phase wt. % Ni | Binder phase wt. % Mo | Hardness ($HV_{10}$) | Transverse Rupture Strength (MPa) |
|---|---|---|---|---|
| 1 | 9.5 | — | 1122 | 627 |
| 2 | 19.0 | — | 940 | 860 |
| 3 | 28.8 | — | 835 | 1096 |
| 4 | 9.5 | 9.5 | 1114 | 316 |
| 5 | 21.6 | 7.2 | 910 | 815 |
| 6 | 14.4 | 14.4 | 1114 | 497 |

By comparison, a steel bonded titanium carbide (Ferro-Tic CM) containing 45 vol.% TiC particles in a heat-treated 10% chromium steel matrix, has a hardness of 924 $HV_{10}$ and a TRS value of 1886 MPa. Such a material of course has markedly inferior anti-corrosion and anti-oxidation qualities: although a grade of Ferro-Tic is available with a nickel alloy binder, and therefore has better corrosion resistance, this known material has a significantly lower hardness and will therefore perform less well in many respects in comparison with hard metals according to the present invention.

Wear testing was performed according to DIN Standard 50330, using a static pin loaded against a rotating abrasive disc. The wear value is expressed as meters travelled per $mm^3$ of material removed. Values measured were as follows:

TABLE 2

| Alloy | Binder phase wt. % Ni | Hardness ($HV_{10}$) | Wear m/mm$^3$ |
|---|---|---|---|
| 1 | 9.5 | 1122 | 29 |
| 2 | 19.0 | 940 | 24 |
| 3 | 28.8 | 835 | 20 |
| By comparison: | | | |
| Ferro-Tic CM | | 930 | 26 |
| 25% Co-Wc | | 950 | 28 |

These figures indicate that wear rates for the Ni-Mo-N hard metals are therefore in inverse proportion to hardness, and comparable to those of other materials with similar hardnesses.

As a test of oxidation resistance a testpiece of $\beta^m$(Ni-Mo-N) alloy with 28.8 wt.% Ni binder was exposed in air in a muffle furnace at 1000° C. for 24 hours alongside with testpieces of known materials, with the following results:

$\beta^m$ alloy + Ni binder—10–15 μm of oxidation at surface
Ferro-Tic CM—300 μm of oxidation at surface
WC-25 wt.% Co—complete oxidation of 5 mm thick sample The $\beta^m$ hard metal thus showed an excellent oxidation resistance to be exploited in high temperature applications.

Corrosion resistance was tested with samples of the same compositions fully immersed in buffer solutions of pH=4.0 and 9.2 respectively, for 24 h at 40° C.

Corrosion at pH=4:
Alloy 3 (28.8 wt.% Ni)—no detectable corrosion
Ferro-Tic CM—30 μm corroded layer
WC-25 wt.% Co—7.5 μm corroded layer Corrosion at pH=9.2:
Alloy 3 (28.8 wt.% Ni)—0.5 μm corroded layer
Ferro-Tic—15 μm corroded layer
WC-25 wt.% Co—5 μm corroded layer Thus in these tests also, the $\beta^m$ hard metal demonstrated its superiority to conventional hard metals.

The $\beta^m$ hard metals can be utilised in a wide variety of forms for many different purposes. Although for most cutting functions their properties do not match currently known cutter materials they can be used to advantage for cutting in relatively low temperature corrosive conditions, in particular as saw teeth for wood saws. Their corrosion resistance can also give them a place in wear parts, e.g. in pumps for sea water or acids. Since they are similarly resistant to oxidation they also have a high temperature application in such places as the rollers of delay tables in hot rolling mills and gas turbine blading.

In many instances the wear properties of the $\beta^m$ hard metals and their resistance to corrosion and oxidation can best be exploited by their use as a coating on a part requiring protection. It is common for high temperature components such as turbine blades to be formed from nickel-rich alloys on which the $\beta^m$ phase can provide a very coherent coating to confer high corrosion resistance, while its coefficient of expansion ($8 \times 10^{-6}$/° C.) is compatible with these and a wide range of metals and alloys in common use.

A $\beta^m$ coating can be obtained by sputtering the required metal compositions (e.g. 2N:3Mo) in a suitable atmosphere (e.g. hydrogen:nitrogen if a nitride is to be formed) to deposit the $\beta^m$ phase directly. Alternatively the metals may be deposited directly by sputtering or evaporation in a vacuum or an inert atmosphere and subsequently heated in a suitable atmosphere to form a $\beta^m$ phase in situ. In a similar two-step process, the metals can be deposited electrolytically.

The range of elements from which it is possible to form the $\beta^m$ phase can be exploited to select properties appropriate for a required purpose. For example, if used for metal cutting the metallic elements of the hard metal could be selected from the range available so as to achieve optimum performance for a specific group of metals to be cut.

It is also within the scope of the invention to use the $\beta$ phase together with other hard materials to combine desired properties. For example, in a composite hard metal of WC:$\beta^m$ bonded with Co:Ni the $\beta$ phase would offer corrosion resistance while the WC component would contribute greater hardness, toughness and wear resistance.

I claim:

1. A composite material or product comprising a mixed metal interstitial alloy together with a metallic carrier, the alloy having the beta-Mn metal-atom arrangement and the formula $X_2Y_3Z$, wherein:
   X is selected from at least one of the group consisting of manganese, iron, cobalt and nickel,
   Y is selected from at least one of the group consisting of vanadium, niobium, tantalum, chromium and molybdenum, and
   Z is a compound selected from at least one of the group consisting of nitride and carbonitride.

2. A composite according to claim 1 in the form of a hard metal, with the metallic carrier functioning as a binder phase for the interstitial alloy.

3. A composite according to claim 1 comprising a preformed metallic body, wherein the interstitial alloy is a coating applied to the surface of said body.

4. A composite according to claim 2 wherein the binder material is at least partially composed of nickel.

5. A composite according to claim 2 wherein at least part of the binder material is selected from the group consisting of Fe, Co, Cr and Mn.

6. A composite according to claim 4 wherein molybdenum is a partial constituent of the binder material.

7. A composite according to claim 1 wherein said interstitial alloy is Ni-Mo-N.

* * * * *